United States Patent [19]
Kongetira

[11] Patent Number: 6,078,987
[45] Date of Patent: Jun. 20, 2000

[54] TRANSLATION LOOK ASIDE BUFFER HAVING SEPARATE RAM ARRAYS WHICH ARE ACCESSABLE WITH SEPARATE ENABLE SIGNALS

[75] Inventor: Poonacha Kongetira, San Jose, Calif.

[73] Assignee: Sun Microsystems, Inc., Palo Alto, Calif.

[21] Appl. No.: 08/940,297

[22] Filed: Sep. 30, 1997

[51] Int. Cl.[7] ................................................ G06F 12/00
[52] U.S. Cl. .................... 711/108; 711/104; 711/205; 711/207; 365/49; 365/189.05
[58] Field of Search .............................. 711/1, 104, 105, 711/108, 200, 207, 205; 365/49, 189.05

[56] References Cited

U.S. PATENT DOCUMENTS

| | | | |
|---|---|---|---|
| 5,222,222 | 6/1993 | Mehring et al. | 711/207 |
| 5,299,147 | 3/1994 | Holst | 365/49 |
| 5,327,372 | 7/1994 | Oka et al. | 365/49 |
| 5,475,825 | 12/1995 | Yonezawa et al. | 711/1 |
| 5,638,315 | 6/1997 | Braceras et al. | 365/49 |
| 5,642,114 | 6/1997 | Komoto et al. | 341/67 |
| 5,659,697 | 8/1997 | Dietz | 711/108 |
| 5,802,567 | 9/1998 | Liu et al. | 711/108 |
| 5,805,504 | 9/1998 | Fujita | 711/105 |
| 5,806,083 | 9/1998 | Edgar | 711/108 |
| 5,835,963 | 11/1998 | Yoshioka et al. | 711/207 |

OTHER PUBLICATIONS

Heald et al., "A 6–ns Cycle 256–kb Cache Memory and Memory Management Unit,"IEEE Journal of Solid–State Circuits, vol. 28, No. 11, Nov. 1993, pp. 1078–1083.
European Search Report for Application No. 98 30 7794 mailed Aug. 3, 1999.

*Primary Examiner*—Tuan V. Thai
*Attorney, Agent, or Firm*—Conley, Rose & Tayon, PC; B. Noel Kivlin

[57] ABSTRACT

A unified array access for two logically different arrays is provided. The first array includes CAM cells arranged in n rows and x columns. At least one CAM cell is coupled to a match line, a CAM word line, and to a CAM bit line. The second array includes first RAM cells arranged in n rows and y columns and second RAM cells arranged in n rows and z columns. At least one first RAM cell is coupled to a RAM word line, and to a first RAM bit line. At least one second RAM cell is coupled to the same RAM word line, and a second RAM bit line. RAM word line drivers are provided to activate the first and second RAM cells during a read or write access thereof. At least one RAM word driver has an output coupled to first and second RAM cells. N match sense amplifiers are provided, at least one of which has an input coupled to one of the CAM cells via a match line, and an output coupled to at least one RAM word driver. Y first RAM driver circuits are provided, at least one of which has a first output coupled to the first RAM bit line, a first input configured to receive a first data input signal, and a control input configured to receive a first RAM write enable signal. The first RAM write driver circuit is configured to charge the first RAM bit line in response to receiving the first RAM write enable signal. The second RAM write driver circuits are also provided, at least one of which has a second output coupled to the RAM bit line, a second input configured to receive a second data input signal, and a control input configured to receive a second RAM write enable signal. The second RAM write driver circuit is configured to charge the second RAM bit line in response to receiving the second write enable signal. Moreover, the second RAM write driver circuit is configured to operate independently from the first RAM write driver circuit.

18 Claims, 8 Drawing Sheets

TRANSLATION LOOK ASIDE BUFFER HAVING SEPARATE RAM ARRAYS WHICH ARE ACCESSABLE WITH SEPARATE ENABLE SIGNALS

BACKGROUND OF THE INVENTION

1. Field of the Invention

The present invention relates generally to a memory device. More specifically, the present invention relates to a translation lookaside buffer having a unified array access for two logically different arrays.

2. Description of the Relevant Art

Most modern computers use a virtual addressing scheme which allows the computer to access an address space that is larger than the computer's internal memory. In such a scheme, a virtual address must be translated to physical address before the memory can be accessed. Unfortunately, each translation process ordinarily requires multiple accesses to page and segment tables in the computer's memory, which significantly degrades the computer's performance.

To overcome this problem, a translation lookaside buffer (TLB) is often used to maintain the most recently used virtual address and corresponding physical address. Each TLB entry ordinarily contains a virtual address, a physical address mapped to the virtual address, and typically, special information bits indicative of size, writeability, error, etc. Before translating an input virtual address in the conventional manner, the TLB is searched to see if a physical address mapping for the input virtual address is present. If a physical address mapping is present in the TLB, the physical address may be obtained directly from the TLB and the conventional time wasting translation process is avoided.

FIG. 1 is a block diagram of the conventional TLB 10 which stores a set of virtual address/physical address translations. TLB 10 includes a content addressable memory (CAM) array 12 of CAM cells for storing virtual addresses, a first random access memory (RAM) array 14 of RAM1 cells for storing a plurality of special bits used to qualify the virtual to physical address translation, and a second RAM array 16 of RAM2 cells for storing physical addresses corresponding to virtual addresses stored in CAM array 12.

TLB 10 further includes a plurality of CAM write drivers 20, first RAM write drivers 22, and second RAM write drivers 24. Each of the write drivers 20–24 includes a pair of differential inputs, a control input, and a pair of differential outputs.

Each CAM write driver 20 has a pair of differential outputs coupled respectively to a pair of differential bit lines 30 and 32 within CAM array 12. The differential outputs of first RAM write drivers 22 are coupled respectively to differential bit lines 34 and 36 in first RAM array 14. Differential outputs of second RAM write drivers 24 are coupled respectively to differential bit lines 38 and 40 within second RAM array 16.

The control input of each CAM and first RAM write driver, 20 and 22, respectively, is coupled to a CAM/RAM1 write enable signal line 44. Similarly, each control input of second RAM write driver 24 is coupled to RAM2 write enable signal line 46. In general, the write drivers 20–24 write data to their corresponding storage cells in response to receiving a write enable signal. More particularly, CAM write drivers 20 write virtual address signals in the CAM cells via bit lines 30 and 32 when write drivers 20 receive the CAM/RAM1 write enable signal. First RAM write driver 22 write special bit signals to the RAM1 cells via bit lines 34 and 36 when write drivers 22 receive the CAM/RAM1 write enable signal. Second RAM write drivers 24 write physical address signals to RAM2 cells via differential bit lines 38 and 40 when write drivers 24 receive the RAM2 write enable signal.

TLB further includes CAM read sense amplifiers 50, first RAM read sense amplifiers 52, and second RAM read sense amplifiers 54. Each read sense amplifier has a pair of differential inputs, a control signal input, and a pair of differential outputs.

Each pair of differential inputs to CAM read sense amplifier 50 is coupled to a pair of differential bit lines 30 and 32 within CAM array 12. Each pair of differential inputs to first RAM read sense amplifier 52 is coupled to a pair differential bit lines 34 and 36 within first RAM array 14. Each pair of differential inputs of second RAM read sense amplifier 54 is coupled to a pair of differential bit lines 38 and 40 within second RAM array 16.

Each control input of CAM and first RAM read sense amplifiers 50 and 52, respectively, is coupled to a CAM/RAM1 read enable signal line 58. Each control input of second RAM read sense amplifier 54 is coupled to a RAM2 read enable signal line 60.

In general, each read sense amplifier generates a differential output signal as a function of a differential input signal and in response to receiving a read enable signal. Thus, CAM read sense amplifiers 50 output virtual address signals stored in the CAM cells in response to receiving the CAM/RAM1 read enable signal. First RAM read sense amplifiers 52 output special bit signals stored in the RAM2 cells in response to receiving the CAM/RAM1 read enable signal. Second RAM read sense amplifiers 54 outputs physical address signals stored in RAM2 cells in response to receiving the RAM2 read enable signal.

TLB 10 further includes a plurality of CAM/RAM1 word line drivers 64, and a plurality of RAM2 word line drivers 66. Each CAM/RAM1 word line driver 64 has an output coupled to a row or line of CAM and RAM1 cells within the CAM array 12 and first RAM array 14, respectively, via word line 68. Each RAM2 word line driver 66 is coupled to a row or line of RAM2 cells in second RAM array 16 via word line 70. Each CAM/RAM1 word line driver 64 generates a word line signal which activates a row of CAM and RAM1 cells. Word line driver 64 generates the word line signal in response to receiving a line address signal from a word line decoder (not shown). Likewise, each RAM2 word line driver 66 generates a word line signal which activates a row of RAM2 cell in response to RAM2 word line driver 66 receiving a line address signal from the word line decoder.

TLB 10 also includes a plurality of match sense amplifiers 74, each of which is coupled to a line of CAM cells within CAM array 12 via a match line 76. In a translation operation, one of the match sense amplifiers 74 sense when a virtual address inputted to CAM array 12 matches a virtual address stored within a line of CAM cells therein. As is to be noted within FIG. 1, each match sense amplifier 74 is coupled to one of the CAM/RAM1 word line drivers 64 and RAM2 word line drivers 66. When match sense amplifier 74 senses a match signal on match line 76 indicating that an input virtual address matches the contents of a row of CAM cells, match sense amplifier 74 outputs a signal to both CAM/RAM1 word line driver 64 and RAM to word line driver 66. Upon receipt of the signal from match sense amplifier 74, CAM/RAM1 word line driver 64 outputs a word line signal to its respective line of CAM and RAM1 cells. Similarly, when match sense amplifier 74 generates its signal, RAM2 word line driver 66 outputs a word line signal to its line of RAM2 cells.

CAM array 12 includes a plurality of CAM cells 80 arranged in x columns and n rows. Each row of CAM cells 80 stores a single x bit virtual address and, as noted above, is coupled to one of the CAM/RAM1 word lines 68. Each column of CAM cells 80 is coupled to a pair of CAM differential bit lines 30, 32, and a pair of CAM differential virtual address lines 82, 84. Each row of CAM cells 80, as noted above, is connected to one of the match lines 76. In an address translation, a virtual address is input to differential CAM virtual address bit lines 82 and 84. Thereafter, internal circuitry within CAM cells 80 compares the input virtual address with the CAM cell contents. If a row of CAM cells 80 stores an address which equates to the input virtual address, a match signal is provided on the corresponding match line 76. If the row of CAM cells 80 does not store the address corresponding to the input virtual address, a miss signal is provided on the corresponding match line 76.

Generally, each match sense amplifier 74 includes precharging circuitry (not shown) which precharges the match lines before an address translation cycle. The precharging circuitry is defined by a transistor coupled between a supply voltage and match line 76. The gate of the transistor is configured to receive a precharge pulse signal.

When the transistor is activated by the precharge pulse signal the transistor conducts current to charge match line 76 to a voltage substaintially equal to the supply voltage. Once precharged, CAM array 12 is provided with an input virtual address. If the virtual address does not equate to the contents of a row of CAM cells, one or more of the CAM cells will operate to discharge the corresponding match line 76 to a voltage substantially equal to ground, thereby providing a missed signal on match line 76. If the row of CAM cells contains an address equal to the input virtual address, none of the CAM cells within the row will discharge match line 76. Thus, match line 76 should keep its precharged voltage, thereby indicating a match signal. Match sense amplifier 74, is timed to generate an output signal indicative of the voltage on match line 76 at a particular instant of time. It is to be noted that within the prior art, each CAM cell 80 in a row is connected to a corresponding match sense amplifier 74 via a single sense line 76.

First RAM array 14 includes a plurality of RAM1 cells 88 arranged in n rows and y columns. Each row of RAM1 cells 88 stores n special bits associated with a virtual address stored in the corresponding line of CAM cells 80. Each row of RAM1 cells 88 is coupled to one of the word lines 68, and thus one of the CAM/RAM1 word line drivers 64. Each column of RAM1 cells 88 is coupled to corresponding pair of differential first RAM bit lines 34 and 36.

Second RAM array 16 comprises a plurality of RAM2 cells 98 arranged in n rows and z columns. The RAM2 cells 98 are substantially similar to the RAM1 cells 88. Each row of RAM2 cells stores a single z bit physical address. Each row of RAM2 cells 98 is coupled to one of the RAM2 word line drivers 66 via word line 70. Each column of RAM2 cells 98 is coupled to a corresponding pair of differential RAM2 bit lines 38 and 40. When one of the match sense amplifiers 74 detects a match of an input virtual address, the match sense 74 amplifier issues a corresponding signal to its associated RAM2 word line driver 66 and CAM/RAM1 word line driver 64, which in turn generates a word line signal to the corresponding rows of RAM2 cells 98 and RAM1 cells 88. In response, the corresponding row of RAM2 cells 98 output their physical address contents to differential bit lines 38 and 40, and the corresponding row of RAM1 cells output their special bits to differential bit lines 34 and 36. Read sense amplifiers 54 and 52 receive the physical address and special bits at their differential inputs, and acting in response to RAM2 and CAM/RAM1 read enable signals, output the physical address and special bits, which are concatenated and used to access the computer's main memory (not shown). It is to be noted that in this operation, the corresponding row of CAM cells also output their contents to bit lines 30 and 32.

As noted above, TLB 10 stores the most recently used virtual address/physical address pairs. Often times, TLB 10 must be updated with new virtual address/physical address pairs. TLB 10 is provided with read and write access modes to accomplish content updating. In one write access mode, CAM and first RAM write drivers 20 and 22, respectively, charge differential bit lines 30–36 as a function of data signals received at their inputs, and in response to CAM/RAM1 write enable signal. Thereafter, one of the CAM/RAM1 word line drivers 64, operating in response to a received line decode signal, generates a word line signal received by a corresponding line of CAM cells 80 and RAM1 cells 88. In response, the line of activated CAM cells 80 and RAM cells 88 store the values on differential lines 30–36. In a read operation, one of the CAM/RAM1 word line drivers 64 again receives a line decode signal and generates a word line signal which activates a row of CAM cells 80 and RAM1 cells 88. In response, the activated CAM cells 80 and RAM1 cells 88 output their stored contents onto differential bit lines 30–36. CAM read sense amplifiers 50 and first RAM read sense amplifiers 52 detect the voltage values at their inputs, and in response to a CAM/RAM1 read enable signal on line 58, generate corresponding values at their outputs. Second RAM array 16 is accessed in a similar fashion. It is to be noted that CAM array 12 and first RAM array 14 are accessed concurrently, while second RAM array 16 can be accessed independently of CAM array 12 and first RAM array 14 access.

FIG. 2 shows a schematic diagram of adjacent CAM and RAM1 cells from FIG. 1. RAM1 cell 88 is generally known in the art as a "T6" cell and includes a latch defined by a pair of cross coupled inverters 100 connected between a pair of pass gates 102. Each pass gate 102 is coupled to the output of a CAM/RAM1 driver 64 via a word line 68. Pass gates 102 and intervening inverters 100 are coupled between differential bit lines 34 and 36. Pass gates 102 connect nodes 104 to differential bit lines 34 and 36 in response to CAM/RAM1 line driver 64 charging word line 68 to a high voltage during a read or write operation.

CAM cell 80 includes the T6 circuitry of RAM1 cell 88. Additionally, CAM cell 80 includes match circuitry 106 for comparing a differential virtual address signal provided on differential virtual address bit lines 82 and 84 with the contents of CAM cell 80. Match circuitry 106 includes four transistors 110–116, the first two of which are coupled in series between match line 76 and ground, the second two of which are likewise coupled in series between match line 76 and ground. Transistors 110 and 114 have their gates coupled to nodes 104(a) and 104(b), respectively. Transistors 112 and 116 have their gates coupled to virtual address bit lines 82 and 84. Generally, virtual address bit line 84 is provided with the compliment of the signal on virtual address bit line 82. In operation, match line 76, as noted above, is precharged to a high voltage. If the signal provided on virtual address lines 82 and 84, equal that stored within CAM cell 80, match circuitry 106 will not activate and discharge match sense line 76. In effect, CAM cell 80 creates a match signal by maintaining line 76 at its precharge voltage. On the other hand, if the signal on virtual address lines 82 and 84 do not match the contents stored within CAM cell 80, match circuitry 106 will activate and discharge word line 76 to ground, in effect creating a miss signal on line 76.

As noted above, match sense amplifier 74 has an input coupled to match word line 76, and an output coupled to a corresponding CAM/RAM1 word line driver 64 and RAM2 word line driver 66 (not shown in FIG. 2). When match sense amplifier 74 detects a match between inputted virtual address and the contents of CAM cells 80, match sense amplifier 74 directs the CAM/RAM1 word line driver 64 and RAM2 word line driver 66 to drive word line 68 and 70 to a high voltage which in turn activates all CAM, RAM1 and RAM2 cells coupled thereto. RAM1 cells 88 output their content which are ultimately concatenated with the contents provided by the RAM2 cells.

In a virtual to physical address translation, virtual signals are provided to virtual address lines 82 and 84. If a match occurs between the input virtual address and the contents of a row of CAM cells 80, match sense amplifier 74 directs the corresponding CAM/RAM1 word line driver 64 and RAM2 word line driver to drive word line 68 and 70 to a high voltage. In response, CAM and RAM1 cells 80 and 88 output their data to bit lines 30–36. To translate, only the RAM1 cell contents are needed. Outputting the contents of the CAM cells results in needless power consumption. Further, the virtual address is deasserting just when the CAM/RAM1 word line is activating transistors 102(a) and 102(b). At this instant, their may be noise coupling between the virtual address lines 82 and 84 and bit lines 30 and 32, respectively. This noise could potentially corrupt the data stored within the CAM cells. To avoid data corruption under this scenario, metal lines 120 are added.

In a RAM1 write operation, data to be stored within RAM1 cells 88 are provided on differential bit lines 34 and 36. Thereafter, CAM/RAM1 word line driver 64 operates to activate pass gates 102 thereby coupling nodes 104 to differential bit lines 34 and 36. Once coupled, nodes 104 assume the values of voltage on the differential bit lines 34 and 36. Unfortunately, the pass gates 102 in CAM cell 80 are also activated by CAM/RAM1 word line driver 64. As a result, nodes 104 in CAM cell 80 are coupled to differential bit lines 30 and 32 simultaneously with a write operation to RAM2 cells 88. This provides an opportunity for data stored within CAM cells 80 to be corrupted by signals present on virtual address bit lines 30 and 32. More particularly, as can be seen in FIG. 2, the virtual address lines 82 and 84 run parallel with and adjacent to the differential CAM bit lines 30 and 32. The close proximity of these lines creates a capacitive coupling between signals thereon. When pass gates 102 in CAM cell 80 are activated, data on lines 82 and 84 may inadvertently alter data stored within CAM cell 80. To prevent this unwanted condition, metal lines 120 are provided between the differential bit lines and the differential address lines within each CAM cell 80. The metal lines 120 act to decouple the differential bit lines from the differential address lines and prevent corruption of signals in CAM cell 80 during a write to RAM1 cells 88.

Unfortunately, the decoupling metal lines 120 add significant horizontal thickness to the overall width of the translation lookaside buffer 10. In modem integrated circuit design in which translation lookaside buffer may be employed, overall size of the translation lookaside buffer is a critical design feature. Namely, it is desirable to limit the physical area occupied by the translation lookaside buffer. The addition of the middle lines 120 can add nearly 20% to the overall horizontal width of the CAM array 12.

SUMMARY OF THE INVENTION

The present invention solves the above problems and others and provides a unified array access for two logically different arrays. One embodiment of translation lookaside buffer in which the present invention can be employed, includes a CAM array having n rows and x columns, a first RAM array having n rows and y columns, and a second RAM array having n rows and z columns. At least one CAM cell is coupled to a match line, a CAM word line, and to a CAM bit line. At least one of the first RAM cells is coupled to a RAM word line, and a first RAM bit line. At least one of the second RAM cells is coupled to the RAM word line, and a second RAM bit line. The memory circuit further includes n RAM word line drivers, at least one of which is coupled to the first and second RAM cells via the RAM word line. N match sense amplifiers are also provided at least one of which has an input coupled to the one CAM cell via a match line. An output of the match sense amplifier provides a signal to the RAM word line driver. The memory circuit further includes y first RAM write driver circuits and z second RAM write driver circuits. At least one of the first RAM write driver circuits has a first output coupled to the first RAM bit line, a first input configured to receive a first data input signal, and a control input configured to receive a first RAM write enable signal. At least one of the second RAM write driver circuits has a second output coupled to the second RAM bit line, a second input configured to receive a second data input signal, and a control input configured to receive a second RAM write enable signal. The first RAM write driver circuit is configured to charge the first RAM bit line in response to receiving the first RAM write enable signal. The second RAM write driver circuit is configured to charge the second RAM bit line in response to receiving the second write enable signal. The first and second RAM write driver circuits are configured to operate independently so that the first and second RAM cells can be accessed independently notwithstanding their shared RAM word line and RAM word line driver.

The memory circuit further includes x CAM write driver circuits, at least one of which has an output coupled to the CAM bit line, a data input configured to receive a data input signal, and a control input configured to receive a CAM write enable signal. The CAM write driver is configured to charge the CAM bit line in response to receiving the CAM write enable signal. Further, the CAM write driver circuit is configured to operate independently of the first and second RAM write driver circuits. Accordingly, the CAM cells can be accessed independently of the first or second RAM cells.

One advantage of the present invention is that it provides for a unified array access for two logically different arrays.

Another advantage of the present invention is that it reduces the physical area of a translation lookaside buffer within an integrated circuit.

Another advantage of the present invention is that it operates at a substantially lower power budget.

Yet another advantage of the present invention is that it reduces a circuit complexity which may, in turn, translate into a higher yield rate.

BRIEF DESCRIPTION OF THE DRAWINGS

A better understanding of the present invention can be obtained with the following Detailed Description of the Preferred Embodiments is considered in conjunction with the following diagrams in which.

Figure 1:
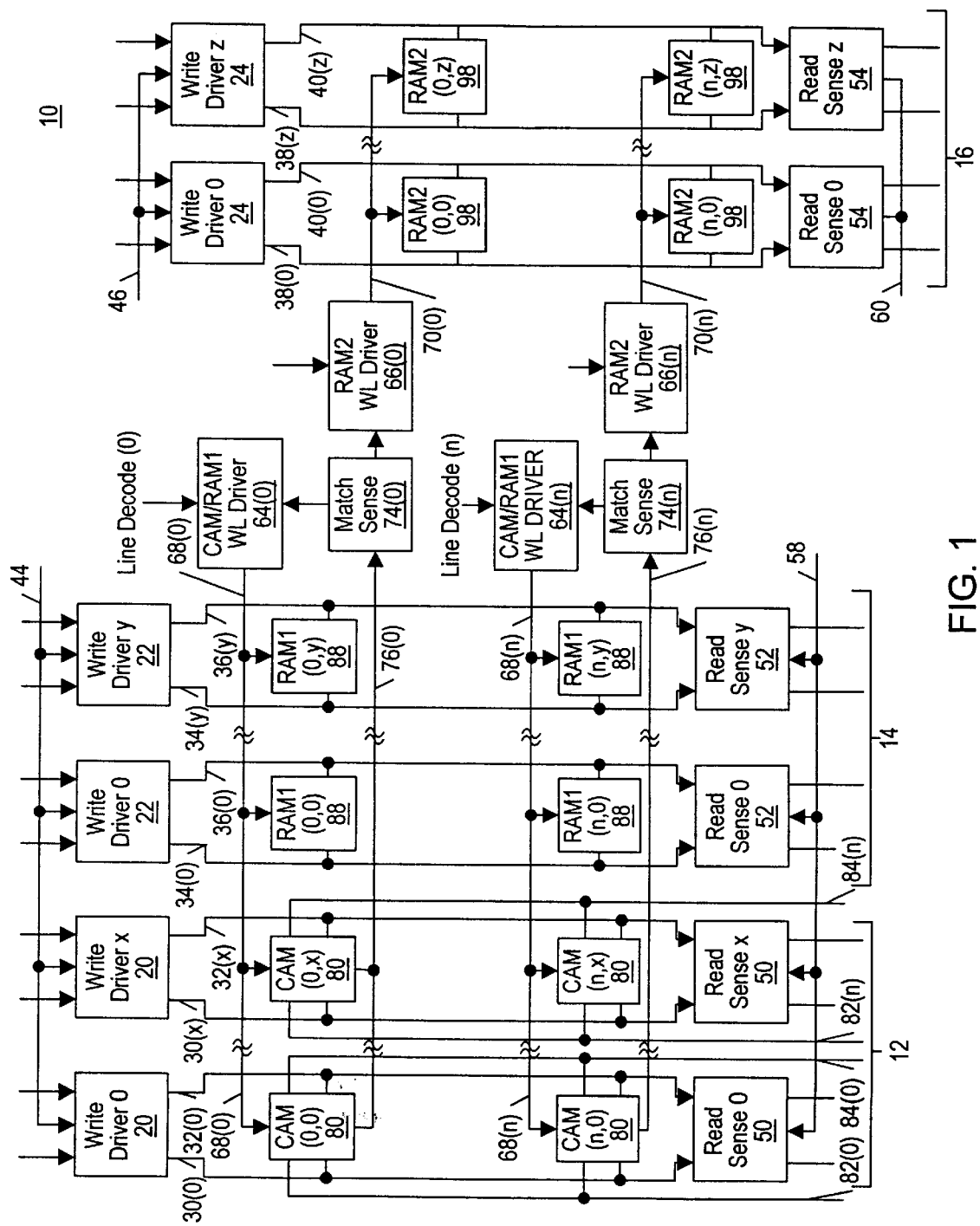
FIG. 1 is a block diagram representing a prior art translation lookaside buffer.

While the invention is susceptible to various modifications and alternative forms, specific embodiments are shown by way of example in the drawings and will herein be described in detail. It should be understood, however, that the drawings and detailed description thereto are not intended to limit the invention to the particular form disclosed, but on the contrary, the invention is to cover all modifications, equivalents, and alternatives falling within the spirit and scope of the present invention as defined by the appended claims.

DETAILED DESCRIPTION OF THE PREFERRED EMBODIMENTS

Figure 3:
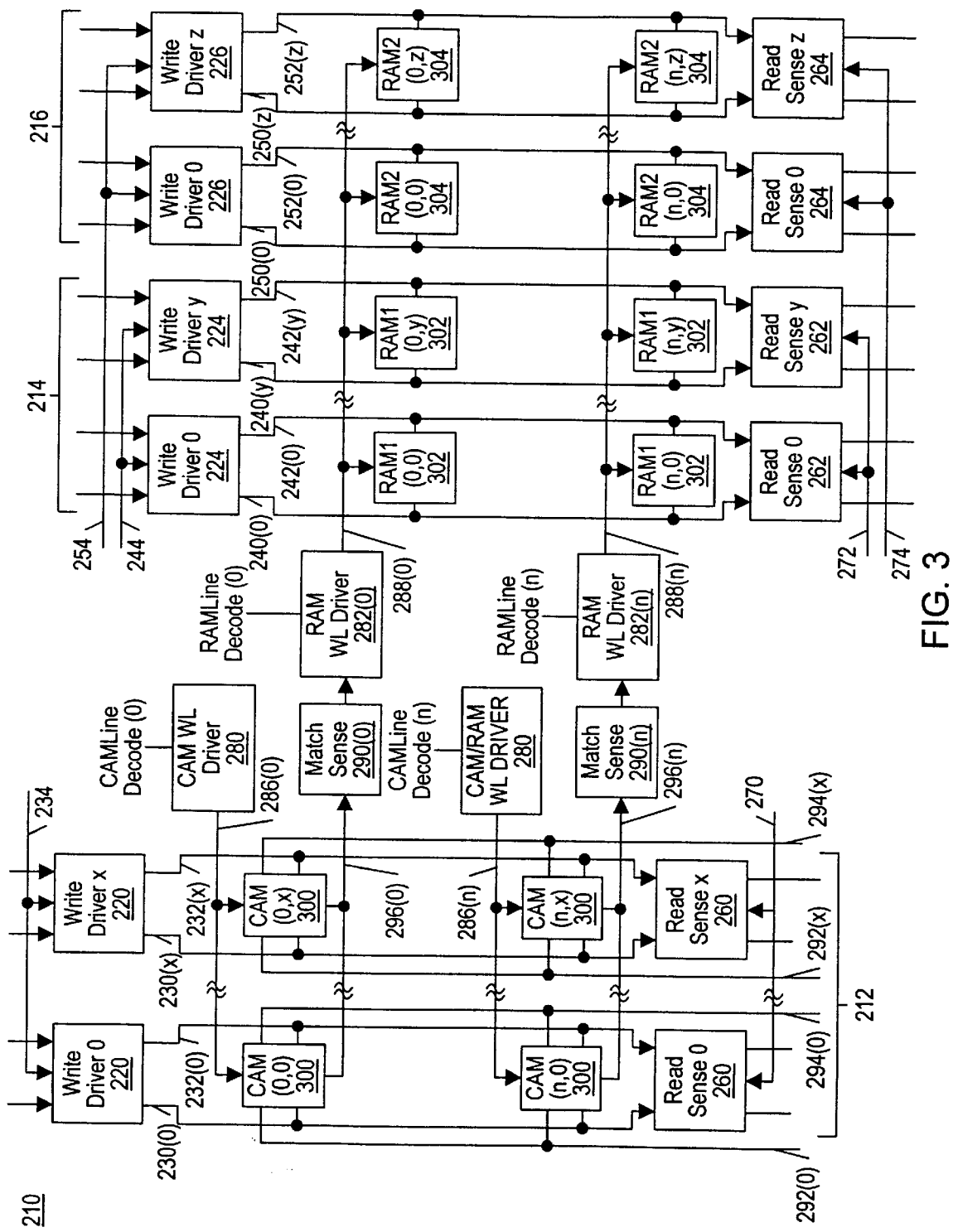
FIG. 3 is a block diagram showing a translation lookaside buffer employing the present invention.

FIG. 3 shows a block diagram of a translation lookaside buffer 210 employing the present invention. The present invention, however, can be employed in other memory devices. TLB 210 includes a CAM array 212, a first RAM array 214, and a second RAM array 216. The CAM array includes CAM cells arranged in n rows and x columns. The first RAM array includes RAM1 cells arranged in n rows and y columns. The second RAM array includes a plurality of RAM2 cells arranged in n rows and z columns. It is to be understood that x, y, and z may have differing values.

TLB 210 further includes a set of CAM write drivers 220, a set of first RAM write drivers 224, and a set of second RAM write drivers 226. Each CAM write driver 220 has a pair of differential inputs, a control input for receiving a CAM write enable signal, and a pair of differential outputs coupled to a pair of differential CAM bit lines 230 and 232. Each CAM write driver 220 is configured to charge CAM differential bit lines 230 and 232 as a function of a differential input signal when CAM write enable signal is asserted on CAM write enable signal line 234. Each of the first RAM write drivers 224 includes a pair of differential inputs for receiving differential input signals, a control input for receiving a first RAM write enable signal, and a pair of differential outputs coupled to a pair of first RAM differential bit lines 240 and 242. Each first RAM1 write driver 224 is configured to charge first RAM differential bit lines 240 and 242 as a function of the signals received at the differential inputs when a first RAM write enable signal is asserted on first RAM write enable signal line 244. Each second RAM write driver 226 includes a pair of differential inputs for receiving differential signals, a control input for receiving a second RAM write enable signal, and a pair of differential outputs coupled to second RAM differential output lines 250 and 252. Each second RAM write driver 226 is configured to charge second RAM differential bit lines 250 and 252 as a function of data received at the differential inputs when the second RAM write enable signal is asserted on second RAM write enable signal line 254.

TLB 210 also includes a set of CAM read sense amplifiers 260, a set of first RAM read sense amplifiers 262, and a set of second RAM read sense amplifiers 264. Each CAM read sense amplifier 260 includes a pair of differential inputs coupled to a pair of CAM differential bit lines 230 and 232, a control input for receiving a CAM read enable signal, and a pair of differential outputs. Each CAM read sense amplifier 260 generates a pair of differential output values as a function of differential data received from one of the CAM cells when the CAM read enable signal is asserted on CAM read enable signal line 270. Each first RAM read sense amplifier 262 has a pair of differential inputs coupled to first RAM differential bit lines 240 and 242, a control input for receiving a first RAM read enable signal, and a pair of differential outputs. Each first RAM read sense amplifier 262 is configured to generate differential output signals as a function of differential inputs received from one of the RAM1 cells when the first RAM read enable signal is asserted on read enable signal line 272. Each second read sense amplifier 264 includes a pair of differential inputs coupled to second RAM differential bit lines 250 and 252, a control input for receiving a second RAM read enable signal, and a pair of differential outputs. Each second RAM read sense amplifier 264 is configured to generate a pair of differential output signals as a function of differential input signals received from one of the RAM2 cells when the second RAM read enable signal is asserted on second RAM read enable signal line 274.

TLB 210 also includes a set of CAM word line drivers 280 and a set of RAM word line drivers 282. Each CAM word line driver 280 has an input for receiving a decoded signal from a line decoder (not shown), and an output coupled to CAM word line 286. It is to be noted that each CAM cell row in CAM array 212 is coupled to a single CAM word line 286. CAM word line driver 280 is configured to generate a signal at its output in response to receiving a line decode signal. CAM word line 286 conveys the generated signal to each CAM cell coupled thereto. Access to the CAM cells is enabled in response to the signal generated by CAM word line driver 280. In this manner, the line of CAM cells coupled to CAM word line driver 280 can be accessed by write drivers 220 or by read sense amplifiers 260. Each RAM word line driver 282 has an output coupled to a RAM word line 288, a pair of inputs, the first of which is coupled to receive a signal from match sense amplifier 290, the second of which is configured to receive a decode signal from the decoder (not shown). It is to be noted that each RAM word line 288 is coupled to a row of RAM1 and RAM2 cells. Each RAM word line driver 282 is configured to generate a signal on RAM word line 288 in response to receiving either a signal from match sense amplifier 290 or from the decoder. Each RAM1 and RAM2 cell coupled to RAM word line 288 receives the RAM word line driver signal, and in response thereto, each RAM1 and RAM2 cell can be accessed by its associated first RAM differential bit lines 240 and 242 and second RAM differential bit lines 250 and 252, respectively.

Lastly, TLB 210 includes a plurality of match sense amplifiers 290, each having an input coupled to a row of CAM cells via sense line 296, and an output coupled to the input of one of the RAM word line drivers 282. Each match sense amplifier 290 detects a match signal on sense line 296 during an address translation operation. Namely, the match signal is produced when a virtual address provided on differential virtual address lines 292 and 294, matches the contents of the associated row of CAM cells. In response to receiving a match signal on match line 296, match sense amplifier 290 generates a signal which causes RAM word line driver 282 to generate a signal for read accessing a corresponding row of RAM1 and RAM2 cells.

CAM array 212, as noted above, includes a plurality of CAM cells 300 each of which is coupled to a CAM word line 286 for receiving the word line signal from word line driver 280, differential virtual address lines 292 and 294 for receiving a differential virtual address inputted to TLB 210, CAM differential bit lines 230 and 232 which provide read and write access to the array, and match lines 296 each of which is coupled to one of the match sense amplifiers 290 as noted above. The first RAM array 214 includes RAM1 cells 302 each of which is coupled to one of the RAM word line drivers 282 for receiving the word line driver signal from word line driver 282, and to first RAM differential bit lines 240 and 242 which provide read and write access to the array. Likewise, second RAM array 216 includes RAM2 cells 304 each of which is coupled to a RAM word line 288 for receiving a signal from RAM word line driver 282, and to a pair of second RAM differential bit lines 250 and 252 which provide read and write access to the array. The RAM1 cells 302 and the RAM2 cells 304 are virtually identical. However, it is to be noted that while each RAM1 and RAM2 cell within a row is coupled to the same word line 288, the RAM1 cells 302 can be accessed independently from the RAM2 cells 304 as will be more fully described below.

CAM array 212 stores a plurality of virtual addresses to be compared against input virtual addresses. Second RAM array 216 stores a plurality of matching physical addresses. First RAM array 214 stores a plurality of special bits used in translating virtual addresses to physical addresses. The special bits may include information associated with physical address size, writeability at the main memory location identified by the physical address, error check, etc. In a translation operation, a multi-bit virtual address is provided by a CPU (not shown) to differential virtual address lines 292 and 294. The input virtual address is compared against the contents stored in each row of CAM cells 300. If one of the rows matches the virtual addresses, a match signal is generated on the corresponding match line 296. Match sense amplifier 290 senses the match signal and in combination with RAM word line driver 282, enables read access to a corresponding row of RAM1 and RAM2 cells. Once accessed, the row of RAM1 and RAM2 cells provide the special ' bits and physical address stored therein to read sense amplifiers 262 and 264 via first RAM differential bit lines 240 and 242, and second RAM differential bit lines 250 and 252, respectively. The output of read sense amplifiers 262 and 264 are concatenated to form the translated physical address.

TLB 210 typically stores the most recently used virtual/physical address matchings. As in the prior art, it is important that the contents within the CAM array 212, first RAM array 214, and second RAM array 216, are updated to accommodate the most recently used virtual/physical address mappings. However, the CAM array, first RAM array, and second RAM array are updated in a significantly different and more advantageous manner when compared with the prior art. In a write access to CAM array 212, a new virtual address is provided to the differential inputs of write drivers 220. A CAM write enable signal is provided, for example, by the CPU to the control inputs of CAM write drivers 220, and a line decode is provided to one of the CAM word line drivers 280. The CAM word line driver receives the line decode signal and activates one row of CAM cells 300 via word line 286. The new virtual address is written into the activated line of CAM cells by write drivers 220 which are enabled by the CAM write enable signal. In a RAM1 write operation, new special bits are provided to the differential inputs of first RAM write drivers 224. Thereafter, first RAM write enable signal is provided to the control input of write drivers 224, and a decode signal is provided to one of the RAM word line drivers 282. A row of RAM1 cells 302 is activated by the RAM word line driver which receives the line decode signal. Once activated, the contents of the RAM1 cells can be updated by first RAM write drivers 224 which are enabled by the first RAM write enable signal. The RAM2 cells are similarly updated. Namely, the differential inputs of second RAM write drivers 226 are provided with a new physical address. Thereafter, the control input is provided with a second RAM write enable signal, and one of the RAM word line drivers 282 is provided with a line decode signal. A line of RAM2 cells is activated by the RAM word line driver 282 which receives the line decode signal. Once activated, the contents of the RAM2 cells can be updated by write drivers 226 which are enabled by the second RAM write enable signal. It is to be noted that each line of RAM1 and RAM2 cells is coupled to the same word line 288. Thus, activation of RAM1 cells likewise activates RAM2 cells and vice versa. However, sense first RAM write drivers 224 and second RAM write drivers 226 receive independent write enable signals via first RAM write enable signal line 244 and second RAM write enable signal line 254, respectively, RAM1 and RAM2 cells can be updated independently. Moreover, it should be noted that the CAM cells 300 can also be updated independently from the RAM1 or RAM2 cells since write drivers 220 are controlled independently from write drivers 224 and 226.

Read access to CAM array 212, the first RAM array 214, and the second RAM array 216 proceeds in a manner similar to updating thereof. Namely, a row of CAM cells is activated by one of the CAM word line drivers 280. Read sense amplifiers 260 then read the contents of the activated line of CAM cells in response to receiving a CAM read enable signal on line 270. Likewise, a row of RAM1 and RAM2 is activated by one of the RAM word line drivers 282. The contents of the activated line of RAM1 and RAM2 cells are read by the first or second RAM read sense amplifiers 262 or 264, or both. One or both sets of read sense amplifiers 262 and 264 generate output signals representative of the contents of the RAM1 and RAM2 signals in response to receiving the first RAM read enable signal on line 292 or the second RAM read enable signal on line 274 or both. Thus, the contents within the CAM array 212, the first RAM array 214, and the second RAM array 216 can be read independently or concurrently.

Figure 4:
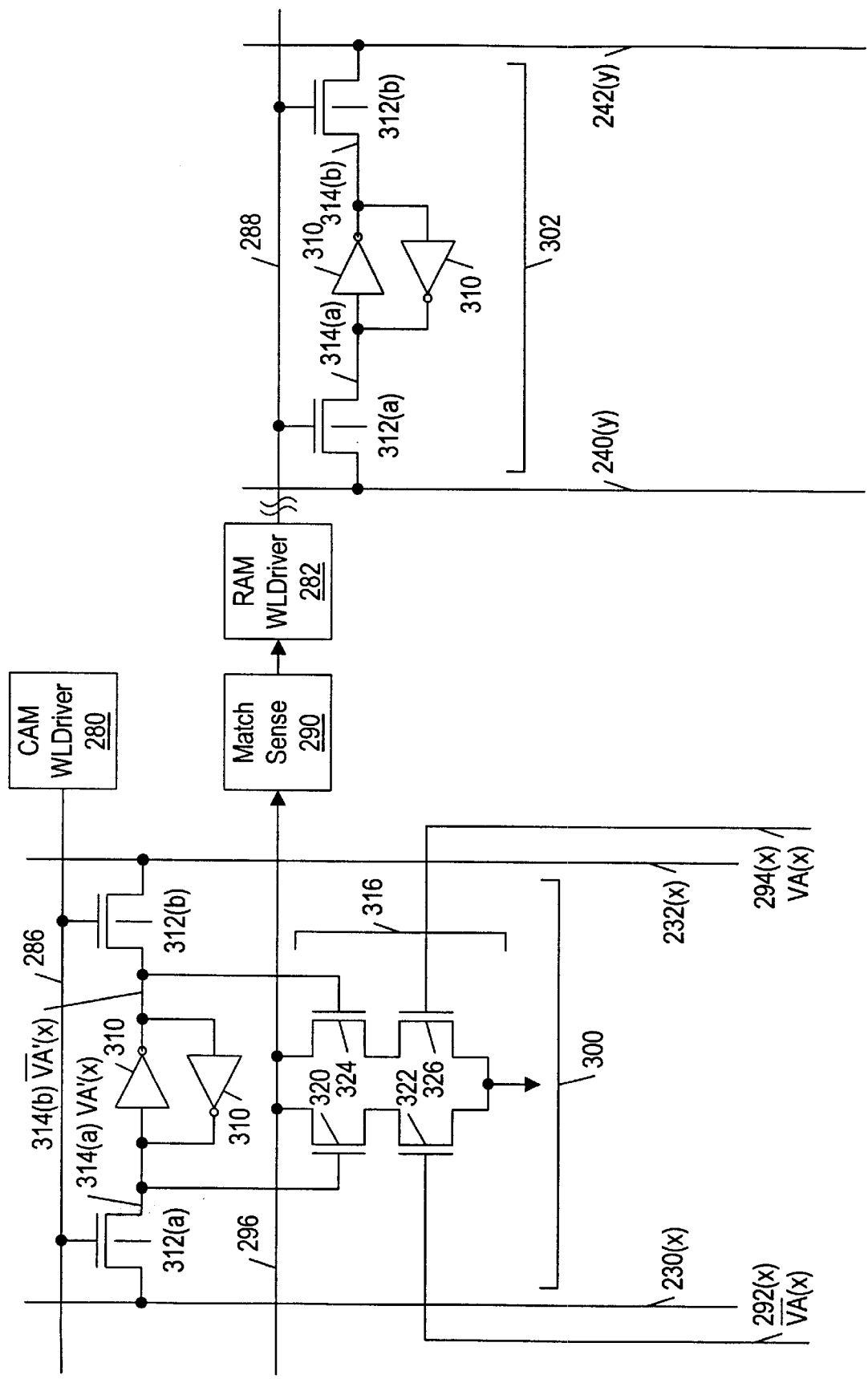
FIG. 4 is a schematic diagram of CAM and RAM1 cells from FIG. 3.

FIG. 4 shows a schematic diagram of a CAM cell 300 and a RAM1 cell 302. The CAM cell 300 includes a latch defined by a pair of cross-coupled inverters 310, the combination of which is between a pair of pass gates 312. The combination of inverters 310 and pass gates 312 define circuitry commonly known in the art as a T6 cell. Pass gate 312 are coupled to line 286. In response to a signal from CAM word line driver 280, pass gates 312 couple nodes 314 to CAM differential bit lines 230 and 232. With the pass gates activated, the signals at nodes 314 can be updated by one of the CAM write drivers or read by one of the CAM read sense amplifiers.

CAM cell 300 further includes match circuitry 316 having four N-channel field effect transistors 320–326. The gates of transistors 320 and 324 are coupled to nodes 314(a) and 314(b). The gates of transistors 322 and 326 are coupled to virtual address lines 292 and 294. Match circuitry 316 is coupled between sense fine 296 and ground. Match circuitry 316 is configured to discharge precharged match line 296 to ground when the virtual address input to differential lines 292 and 294 do not equal the signal stored within CAM cells 300. In other words, match circuitry 316 generates a miss signal on sense line 296 when the input virtual address does not equal the virtual address stored within the row of CAM cells 300. If, however, the input virtual address matches the contents of a row of CAM cells, match circuitry 316 does not activate thereby leaving match line 296 at its precharged voltage level. In effect, the virtual address matches the contents stored within a row of CAM cells 300, match circuitry 316 generates a match signal on match line 296.

RAM1 cell 302 includes T6 circuitry substantially similar to that shown in CAM cell 300. Namely, RAM1 cell 302 includes a latch defined by a pair of cross-coupled inverters 310, the combination of which is connected between a pair of pass gates 312. Pass gates 312 are coupled to RAM word line 288 and operate in response to a signal provided by a RAM word line driver 282. Thus, RAM word line driver activates RAM1 cell 302, and all other cells coupled to RAM word line 288, to allow access thereto. As was noted above, RAM word line 288 controls access to all the RAM1 and RAM2 cells in the same line.

Figure 2:
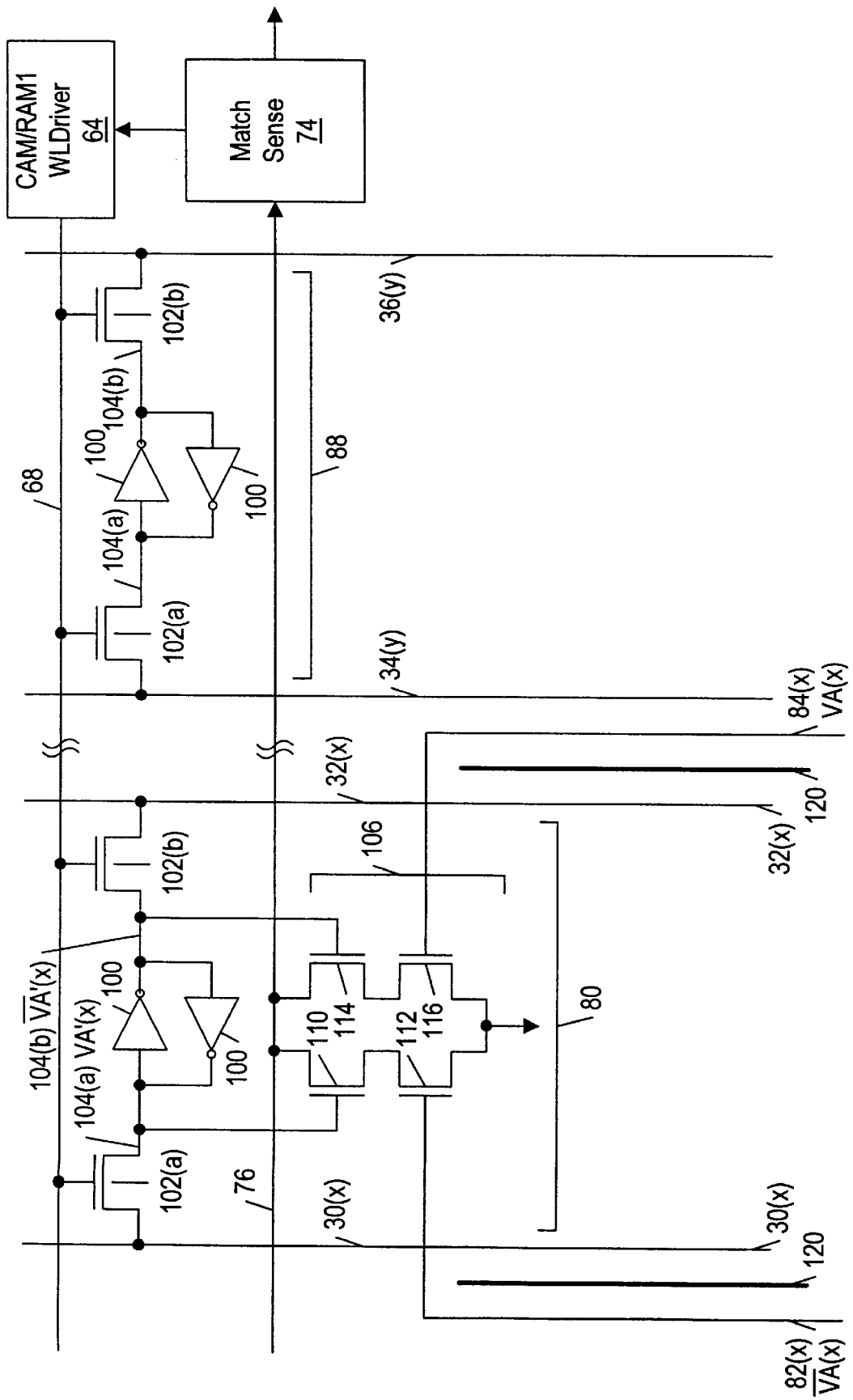
FIG. 2 shows a schematic diagram of CAM and RAM1 cells of the translation lookaside buffer of FIG. 1.

As was noted above, CAM word line driver 380 operates independently of RAM word line driver 282. Accordingly, RAM1 cell 302 can be accessed independently of CAM cell 300. Since RAM word line driver 282 causes access to RAM1 cell 302 independently of CAM cell 300, the value stored within CAM cell 300 cannot be corrupted by cross-coupling between address lines (292 and 294) bit lines (230 and 232) during, for example, a virtual physical address translation. As a result, the decoupling metal strip 120 of FIG. 2 is not needed. The immediate advantage of this is that the physical horizontal width of the TLB 210 on an integrated circuit is reduced substantially. Further, since the RAM1 cells can be accessed independently from the RAM2 cells, there is no need for a separate word line for each row of RAM1 and RAM2 cells, thus reducing the vertical width of the TLB 210.

Figure 5:
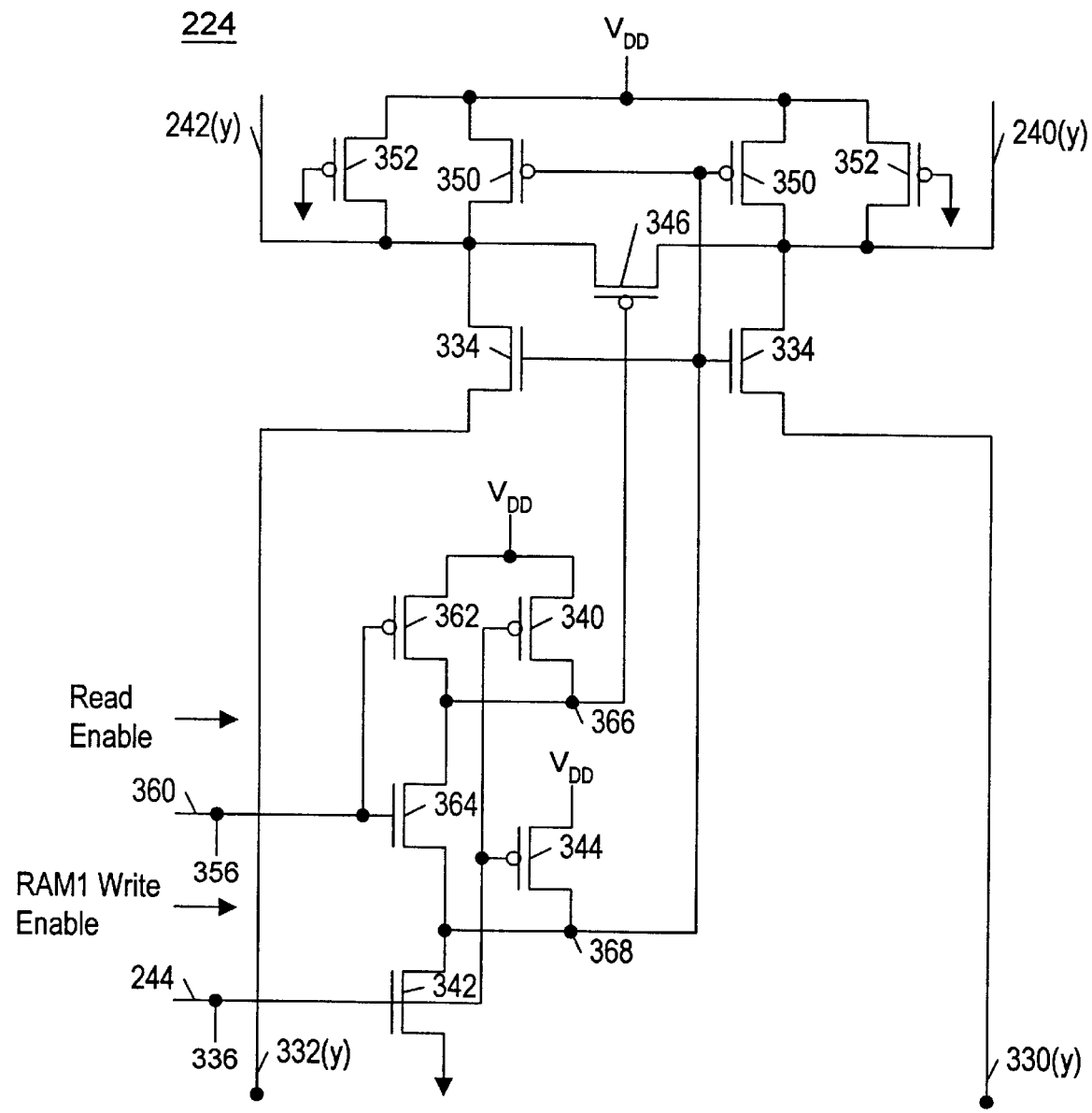
FIG. 5 is a schematic diagram of a RAM write driver circuit shown in FIG. 3.

FIG. 5 is a schematic diagram of one embodiment of the write driver 224 of FIG. 3. The write driver 224 shown in FIG. 3 should not be limited to that shown in FIG. 5. Rather, the present invention contemplates alternative embodiments. Further, the circuit shown within FIG. 5 could function as write driver 220 or 226. However, description of the circuit shown in FIG. 5 will be made with respect to write driver 224.

Write driver 224 includes a pair of differential input nodes 330 and 332 coupled to RAM1 differential bit lines 240 and 242 via pass gates 334. Write enable input node 336 is coupled to RAM1 write enable signal line 244 and is configured to receive the RAM1 write enable signal. Write enable signal node 336 is coupled to a first nand inverter defined by P-channel field effect transistor 340 and N-channel field effect transistor 342, and a second inverter defined by P-channel field effect transistor 344 coupled in series with N-channel field effect transistor 342. The output of the first nand inverter controls P-channel transistor 346 which is coupled between differential bit lines 240 and 242. P-channel transistor 346 operates, when activated, to equalize a precharge voltage on differential bit lines 242 and 240 prior to a write or read access of the corresponding RAM1 cell (not shown). When deactivated during a write or read access, P-channel 346 isolates the differential bit lines 242 and 240. The output of the second inverter controls pass gates 334 and precharge transistors 350. Pass gates 334 are N-channel field effect devices while precharge transistors 350 are P-channel field effect devices. Thus, when pass gates 334 are activated, precharge transistors 350 are deactivated, and vice versa. Precharge transistors 350 are activated between RAM1 cell accesses to charge differential bit lines 242 and 240 to a predetermined voltage level. A second pair of precharge transistors 352 are coupled to RAM1 differential bit lines 242 and 240. The second pair of precharge transistors 352 are P-channel field effect devices whose gates are coupled to ground. Precharge transistors 352 operate to conduct a weak biasing current to the read sense amplifiers (not shown in FIG. 5).

Figure 6:
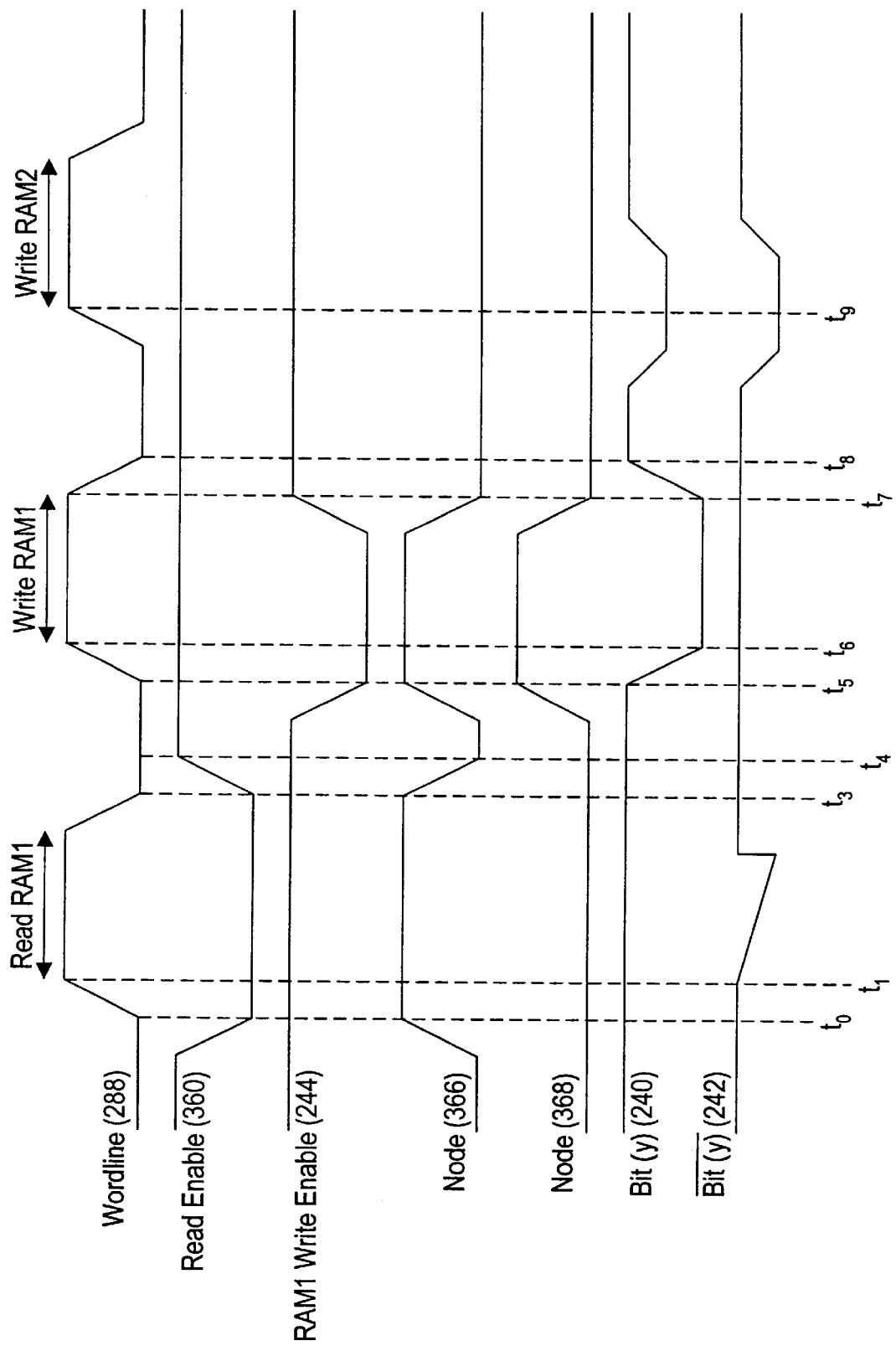
FIG. 6 is a timing diagram showing the operational aspects of the RAM1 write driver circuit of FIG. 5.

Write driver 220 also includes a read enable input node 356 coupled to a read enable line 360 and to the gates of second nand inverter defined by P-channel field effect transistor 362 and N-channel transistor 364. The output of this second inverter is coupled to P-channel transistor 346 and controls activation thereof FIG. 6 is a timing diagram which describes the operation aspects of the RAM1 write driver circuit 224 shown in FIG. 5. At time t0, read enable signal provided on line 360 is asserted as a low voltage while RAM1 write enable signal provided on line 244 is deasserted as a high voltage. In this mode, a RAM1 cell activated by the high voltage on word line 288, can be read. In response, N-channel transistor 342 is activated allowing the first inverter (P-channel transistor 362 and N-channel 364) to charge internal node 366 to a high voltage. A high voltage on node 366 deactivates P-channel transistor 346 thereby isolating bit lines 242 and 240. With RAM1 write enable signal deasserted to a high voltage, the second inverter (P-channel transistor 344 and N-channel transistor 342) charges node 368 to a low voltage. In response, pass gates 334 are deactivated thus isolating the write driver input nodes 332 and 330 from the differential bit lines 242 and 240. In this mode, RAM1 cell (not shown) activated by the signal on word line 288 can only be read by a read sense amplifier. At time t3, the signal on word line 288 (not shown) is removed thereby deactivating the corresponding RAM1 cell.

At time t4, read enable signal is deasserted to a high voltage causing the voltage at node 366 to go low which activates P-channel transistor 346. In this mode, bit lines 240 and 242 can be precharged for the next data cycle by low precharge transistors 340. Activation of P-channel 346 equalizes the precharge voltage on the two bit lines.

At time t5, the RAM1 write enable signal on line 244 is asserted to a low voltage to begin a write access mode. In response, voltages on nodes 366 and 368 charge to a high value. As a result, pass gates 334 are activated thereby coupling input nodes 330 and 332 to bit lines 240 and 242, P-channel transistor 346 is deactivated, thereby decoupling bit lines 230 and 232, and precharge transistors 350 are deactivated. At time t6, the signal on word line 286 is activated thereby enabling access to one the RAM1 cell. The differential signal present on input nodes 330 and 332 is written to the enabled RAM1 cell via bit lines 240 and 242.

At time t7 the RAM1 write enable signal on line 244 is deasserted to a high voltage to begin another precharging cycle. Pass gates 334 are deactivated and precharge transistors 350 are activated. At time t9, the signal on word line 288 is again asserted. However, because the RAM1 write enable signal on line 244 is not asserted as a low voltage, input nodes 330 and 332 are not coupled to bit lines 240 and 242.

In this mode, a RAM2 cell 304 may be accessed notwithstanding the fact that the corresponding RAM1 cell within the same line is enabled by the high voltage on line 288 word line signal.

FIG. 6 is schematic diagram of one embodiment of the RAM1 read sense amplifier 262. It is to be understood that the read sense amplifier 262 may take form in a variety of differing embodiments, FIG. 6 showing only one embodiment. Moreover, the circuit shown in FIG. 6 can be used as a CAM read sense amplifier 260 or a second RAM2 read sense amplifier 264. However, description of the circuit shown in FIG. 6 will be made with reference to the RAM read sense amplifier 262.

Read sense amplifier 262 includes a pair of differential output nodes 370 and 372 coupled to first RAM differential bit lines 240 and 242 via NAND gates 374 and P-channel transistors 376. Each NAND gate 374 includes a pair of P-channel field effect transistors 380 and 382, the combination of which is coupled in series with N-channel field effect transistors 384 and 386. Read sense amplifier 262 also includes a NOR circuit 390 having a pair of series coupled P-channel field effect transistors 392 and 394, the combination of which is coupled in series with a pair of parallel coupled N-channel field effect transistors 396 and 398. An output node 402 of NOR gate 390 is coupled to the gate P-channel transistors 380 and N-channel transistors 384 of NAND gates 374. Read sense amplifier 262 also includes an N-channel transistor 404 coupled between nodes 406 and 408, and pair of N-channel transistors 410 and 412, N-channel transistor 410 being coupled between node 406 and ground, and N-channel transistor 412 being coupled between node 408 and ground. The gates of N-channel transistors 412 and 410 are cross-coupled to nodes 408 and 406, respectively. Further, as noted in FIG. 6, node 406 is coupled to the gate of P-channel transistor 382($a$) while node 408 is coupled to the gate of P-channel transistor 382($b$). The gate of N-channel transistor 404 is coupled to an input node 416 which is configured to receive an equalization signal. Lastly, first RAM read sense amplifier 262 includes an inverter 420 coupled between control input node 422 and the gates of transistors 392 and 396. Input node 422 is coupled to first RAM read enable signal line 272 and is configured to receive the first RAM read enable signal.

Figure 7:
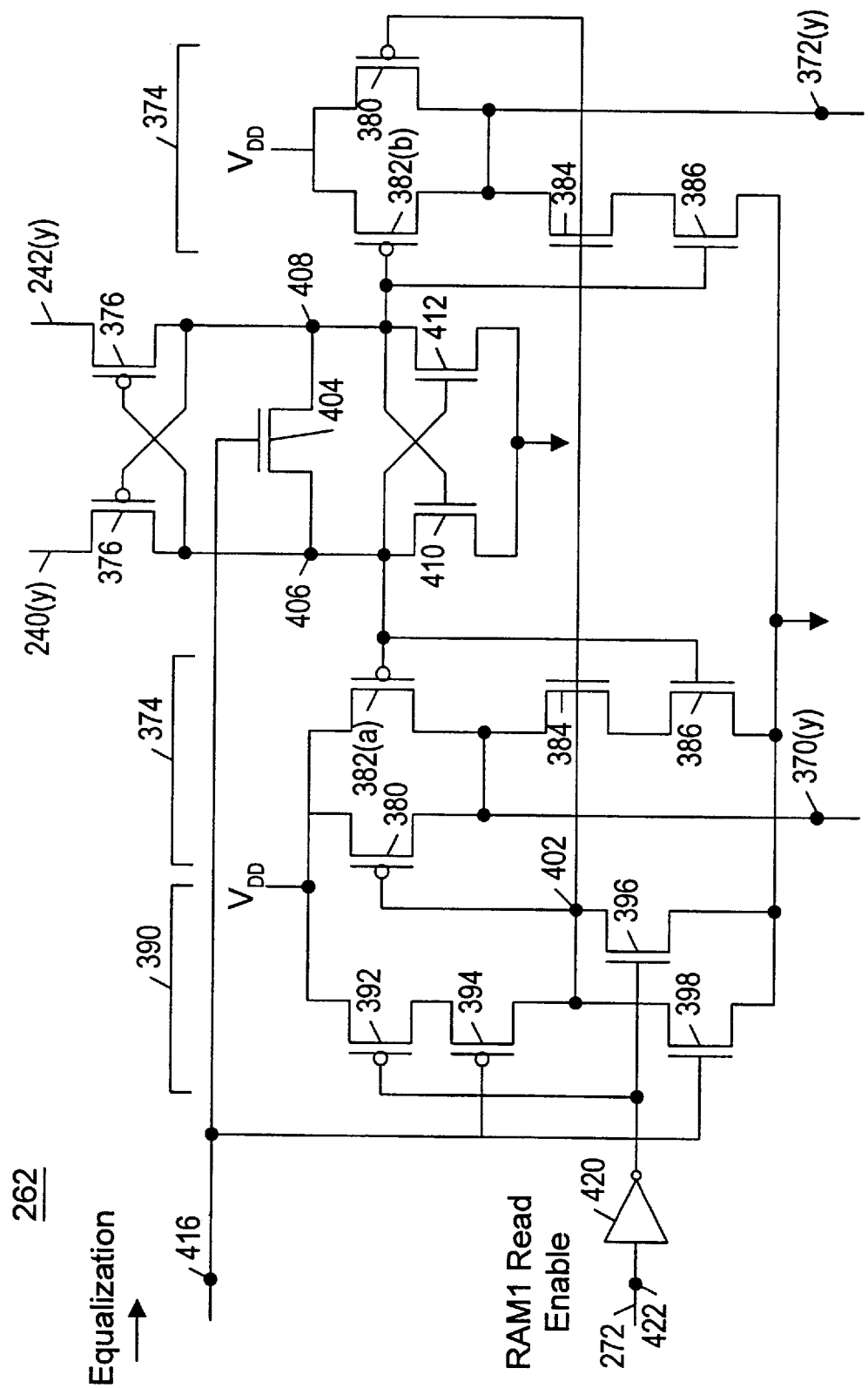
FIG. 7 is a schematic diagram of a RAM read sense amplifier employed in the translation lookaside buffer of FIG. 3.
Figure 8:
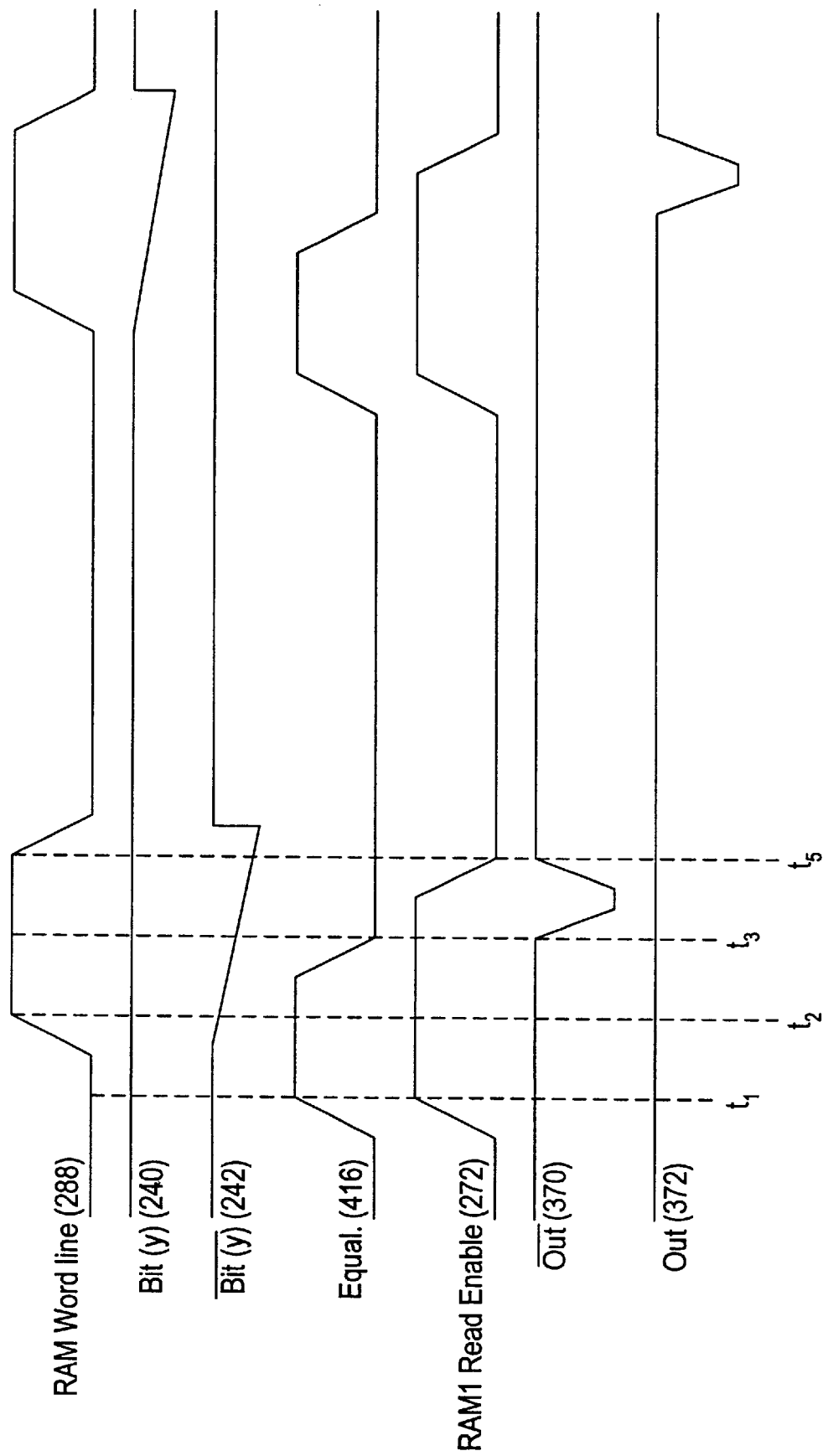
FIG. 8 is a timing diagram illustrating the operational aspects of the RAM read sense amplifier shown in FIG. 7.

FIG. 8 is a timing diagram describing the operational features of the first RAM read sense amplifier 262 shown in FIG. 7. At time $t_1$, the equalization signal provided to input node 416, and the RAM1 read enable signal provided to input node 422, are asserted high thereby providing a high voltage at input nodes 416 and 422. The high voltage on input node 416 activates N-channel transistor 404 thereby coupling nodes 406 and 408. Once coupled, the nodes equalize to a voltage which activates P-channel transistors 376. The high voltage on input node 416 also activates N-channel transistor 398, thus driving the output 402 of NOR gate 390 to a low voltage. A low voltage output of NOR gate 390 activates P-channel transistors 380 which in turn drives output nodes 370 and 372 to a high voltage state.

At time $t_2$, the signal on word line 288 is asserted high thereby activating one of the RAM1 cells coupled to bit lines 240 and 242. Depending on the content of the activated RAM1 cell, one of the bit lines 240 or 242 begin to discharge toward ground.

At time $t_3$, the equalization signal is deactivated thereby driving input node 416 to a low voltage which in turn deactivates N-channel transistor 404 thus isolating nodes 406 and 408. As a result, nodes 406 ad 408 begin to separate to the voltages corresponding to bit lines 240 and 242. It is noted that with the RAM1 read enable signal asserted high at input node 422 and the equalization signal asserted low at input node 416, the output 402 NOR of gate 390 is asserted high thereby enabling NAND gates 374 to generate an inversion of the signals present on nodes 406 and 408. Thus, at time $t_4$, output node 370 is charged to a voltage which is an inversion of the voltage at node 406, and output node 372 is charged to voltage which is the inversion of the voltage on node 408. At time $t_5$, the first RAM read enable signal provided to input node 422 is deasserted causing the output 402 NOR gate 390 to generate a low voltage. A low voltage and output 402 causes P-channel transistors 380 to activate thereby charging output nodes 370 and 372 to a high voltage state. Nodes 406 and 408, however, latch their previous state until the equalization signal is once again asserted high at input node 416.

The foregoing description of the invention is illustrative and explanatory thereof and various changes in the apparatus or method may be made without departing from the invention as set forth in the following claims.

What is claimed is:

1. A memory circuit comprising:

a cam array having n rows and x columns of cam cells, at least one cam cell being coupled to a match line, a cam word line, and to a cam bit line;

a first ram array having n rows and y columns of first ram cells, at least one first ram cell being coupled to a ram word line, and a first ram bit line;

a second ram array having n rows and z columns of second ram cells, at least one second ram cell being coupled to the ram word line, and a second ram bit line;

n ram word line drivers, at least one ram word driver having an output coupled to the ram word line;

n match sense amplifiers, at least one match sense amplifier having an input coupled to the match line and an output coupled to the at least one ram word line driver;

y first ram write driver circuits, at least one first ram write driver circuit having a first output coupled to the first ram bit line, a first input configured to receive a first data input signal, and a control input configured to receive a first ram write enable signal;

wherein the at least one first ram write driver circuit is configured to charge the first ram bit line in response to receiving the first ram write enable signal;

z second ram write driver circuits, at least one second ram write driver circuit having a second output coupled to the second ram bit line, a second input configured to receive a second data input signal, and a control input configured to receive a second ram write enable signal;

wherein the at least one second ram write driver circuit is configured to charge the second rain bit line in response to receiving the second write enable signal;

wherein the first ram write enable signal is separate and distinct from the second ram write enable signal.

2. The memory circuit of claim 1 further comprising x cam write driver circuits, at least one cam write driver circuit having an output coupled to the cam bit line, a data input configured to receive a data input signal, and a control input configured to receive a cam write enable signal, wherein the at least one cam write driver is configured to charge the cam bit line in response to receiving the cam write enable signal.

3. The memory circuit of claim 1 further comprising:

y first ram read sense amplifier circuits, at least one first ram read sense amplifier circuit having a first input coupled to the first ram bit line, a first output configured to generate a first data output signal, and a control input configured to receive a first ram read enable signal, wherein the first ram data output is configured to generate the first data output signal in response to receiving the first ram read enable signal and;

z second ram read sense amplifier circuits, at least one second read sense amplifier circuit having a second input coupled to the second ram bit line, a second output configured to generate a second data output signal, and a control input configured to receive a second ram read enable signal, wherein the second output is configured to generate the second data output signal in response to receiving the second ram read enable signal.

4. The memory circuit of claim 3 further comprising x cam read sense amplifier circuits, at least one cam read sense amplifier circuit having a cam input coupled to the cam bit line, a cam output configured to generate a cam data output signal, and a control input configured to receive a cam read enable signal, wherein the cam output is configured to generate the cam data output signal in response to receiving the cam read enable signal.

5. The memory circuit of claim 1 wherein the first ram write driver circuit comprises a first transistor which selectively couples the first output to the first input in response to the first ram write driver receiving first ram write enable signal.

6. The memory circuit of claim 5 wherein the first ram write driver circuit further comprises a second transistor coupled between a first supply voltage and the first output, wherein the second transistor is configured to selectively conduct current for precharging the first ram bit line.

7. The memory circuit of claim 6 wherein the first ram write driver circuit further comprises an inverter having an input coupled to the control input and an output coupled to a gate of the first transistor and a gate of the second transistor.

8. The memory circuit of claim 7 wherein the first transistor is an n-channel device, and the second transistor is a p-channel device.

9. The memory circuit of claim 1 wherein the first ram read sense amplifier circuit comprises a nand gate having a pair of inputs and an output, a first nand input being coupled to the first ram bit line, the second nand input being coupled to the read control input, the nand output being coupled to the first ram read sense amplifier circuit output.

10. A memory circuit comprising:
a cam array having n rows and x columns of cam cells, at least one cam cell being coupled to a match line, a cam word line, and cam differential bit lines;
a first ram array having n rows and y columns of ram cells, at least one first ram cell being coupled to a ram word line, and first ram differential bit lines;
a second ram array having n rows and z columns of ram cells, at least one second ram cell being coupled to the ram word line, and second ram differential bit lines;
n ram word line drivers, at least one ram word driver having an output coupled to the ram word line;
n match sense amplifiers, at least one match sense amplifier having an input coupled to the match line and an output coupled to the at least one ram word line driver;
y first ram write driver circuits, at least one first ram write driver circuit having first differential outputs coupled to the first ram differential bit lines, first differential inputs configured to receive first differential input signals, and a first write control input configured to receive a first write enable signal;
wherein the at least one first ram write driver circuit is configured to charge the first ram differential bit lines in response to receiving the first ram write enable signal;

z second ram write driver circuits, at least one second ram write driver circuit having second differential outputs coupled to the second ram differential bit lines, second differential inputs configured to receive second differential input signals, and a second write control input configured to receive a second ram write enable signal;
wherein the at least one second ram write driver circuit is configured to charge the second ram differential bit lines in response to receiving the second ram write enable signal;
wherein the first ram write enable signal is separate and distinct from the second ram write enable signal.

11. The memory circuit of claim 10 further comprising x cam write driver circuits, at least one cam write driver circuit having differential outputs coupled to the cam differential bit lines, differential inputs configured to receive differential input signals, and a write control input configured to receive a cam write enable signal, wherein the at least one cam write driver circuit is configured to charge the cam differential bit lines in response to receiving the cam write enable signal.

12. The memory circuit of claim 10 further comprising:
y first ram read sense amplifier circuits, at least one first ram read sense amplifier circuit having first differential inputs coupled to the first ram differential bit lines, first differential outputs configured to generate first differential output signals, and a first read control input configured to receive a first ram read enable signal, wherein the first differential outputs are configured to generate the first differential output signals in response to receiving the first ram read enable signal, and;

z second ram read sense amplifier circuits, at least one second read sense amplifier circuit having second differential inputs coupled to the second ram differential bit lines, second differential outputs configured to generate second differential output signals, and a second control input configured to receive a second ram read enable signal, wherein the second differential outputs are configured to generate the second differential output signals in response to receiving the second ram read enable signal.

13. The memory circuit of claim 10 wherein the at least one first ram write driver circuit comprises a first pair of transistors which selectively couple the first differential inputs to the first differential outputs in response to the at least one write driver circuit receiving the first write driver enable signal.

14. The memory circuit of claim 13 wherein the at least one first ram write driver circuit further comprises a second pair of transistors coupled between a first supply voltage and the first differential outputs, wherein the second pair of transistors are configured to selectively conduct current for precharging the first differential ram bit lines.

15. The memory circuit of claim 14 wherein the at least one first ram write driver circuit further comprises a third transistor for selectively coupling the first differential output lines.

16. The memory circuit of claim 15 wherein the at least one first ram write driver circuit further comprises an inverter having an input coupled to the first control input, and an output coupled to gates of the first and second pairs of transistors.

17. The memory circuit of claim 16 wherein the first pair of transistors are n-channel devices, and the second pair of transistors are p-channel devices.

18. The memory circuit of claim 17 further comprising a nand gate having a pir of inputs and an output, a first nand input being coupled to the first control input, a second nand input being coupled to a read enable input, wherein the third transistor is a p-channel device, a gate of which of which is coupled to the nand output.

* * * * *

UNITED STATES PATENT AND TRADEMARK OFFICE

CERTIFICATE OF CORRECTION

PATENT NO. : 6,078,987

DATED : June 20, 2000

INVENTOR(S) : Poonacha Kongetira

It is certified that error appears in the above-identified patent and that said Letters Patent is hereby corrected as shown below:

Claim 1, col. 14, line 54, please change "rain" to "RAM".

Signed and Sealed this

Tenth Day of April, 2001

Attest:

NICHOLAS P. GODICI

Attesting Officer     Acting Director of the United States Patent and Trademark Office